United States Patent [19]

Miya et al.

[11] Patent Number: 5,697,087
[45] Date of Patent: Dec. 9, 1997

[54] SEMICONDUCTOR DEVICE WITH A FILTER FORMED OF 3-ELEMENT SERIES-AND-PARALLEL RESONATORS

[75] Inventors: Tatsuya Miya; Tsutomu Noguchi, both of Tokyo, Japan

[73] Assignee: NEC Corporation, Tokyo, Japan

[21] Appl. No.: 547,428

[22] Filed: Oct. 24, 1995

Related U.S. Application Data

[63] Continuation of Ser. No. 187,091, Jan. 25, 1994, abandoned.

[30] Foreign Application Priority Data

Jan. 25, 1993 [JP] Japan .................................. 5-009634

[51] Int. Cl.$^6$ .................................................. H04B 1/10
[52] U.S. Cl. ..................... 455/307; 455/289; 455/339; 333/204
[58] Field of Search ...................................... 455/291, 292, 455/293, 302, 307, 333, 339, 252.1, 289; 333/175, 181, 184, 185, 204, 219

[56] References Cited

U.S. PATENT DOCUMENTS

| 4,412,351 | 10/1983 | Onishi et al. | 455/327 |
|---|---|---|---|
| 4,464,636 | 8/1984 | Dobrovolny | 455/252.1 |
| 4,491,976 | 1/1985 | Saitoh et al. | 455/316 |
| 4,601,062 | 7/1986 | Hettiger | 455/307 |
| 5,019,794 | 5/1991 | Letessier et al. | 333/175 |
| 5,032,810 | 7/1991 | Kaneko et al. | 333/175 |
| 5,166,621 | 11/1992 | Codrington et al. | 333/175 |
| 5,202,656 | 4/1993 | Clark et al. | 333/185 |
| 5,220,298 | 6/1993 | Nagase | 333/185 |
| 5,361,050 | 11/1994 | Einbinder | 333/204 |
| 5,584,067 | 12/1996 | Buer et al. | 455/302 |

OTHER PUBLICATIONS

"A Low-Current Ku-Band GaAs Monolithic Image Rejection Down-Converter", Yoshimasu, et al., IEEE Journal of Solid-State Circuits, No. 10, 1992, pp. 1448-1451.
"A New Receiver Filter Transformation", Helkey, No. 9, Microwave Journal, pp. 207, 208, 210, 212, 1990.

*Primary Examiner*—Edward F. Urban

[57] ABSTRACT

A 3-element series parallel resonator, which performs series resonance and parallel resonance at a predetermined frequency by a combination of three elements including an inductor and a capacitor of concentrated constants, is used as a filter. This design can reduce the circuit constant and permits a filter to be formed on a semiconductor substrate. Accordingly, various micro-wave devices, such as an amplifier which requires a filter, a frequency converter, a multiplier and signal switcher, can be designed into an MMIC on a single chip.

2 Claims, 7 Drawing Sheets

SEMICONDUCTOR DEVICE WITH A FILTER FORMED OF 3-ELEMENT SERIES-AND-PARALLEL RESONATORS

This is a continuation, of application Ser. No. 08/187, 091, filed Jan. 25, 1994 now abandoned.

BACKGROUND OF THE INVENTION

1. Field of the Invention

The present invention relates to a semiconductor device, and, more particularly, to a semiconductor device having a filter, such as a micro-wave filter, an amplifier, a mixer or a multiplier.

2. Description of the Prior Art

Figure 1:
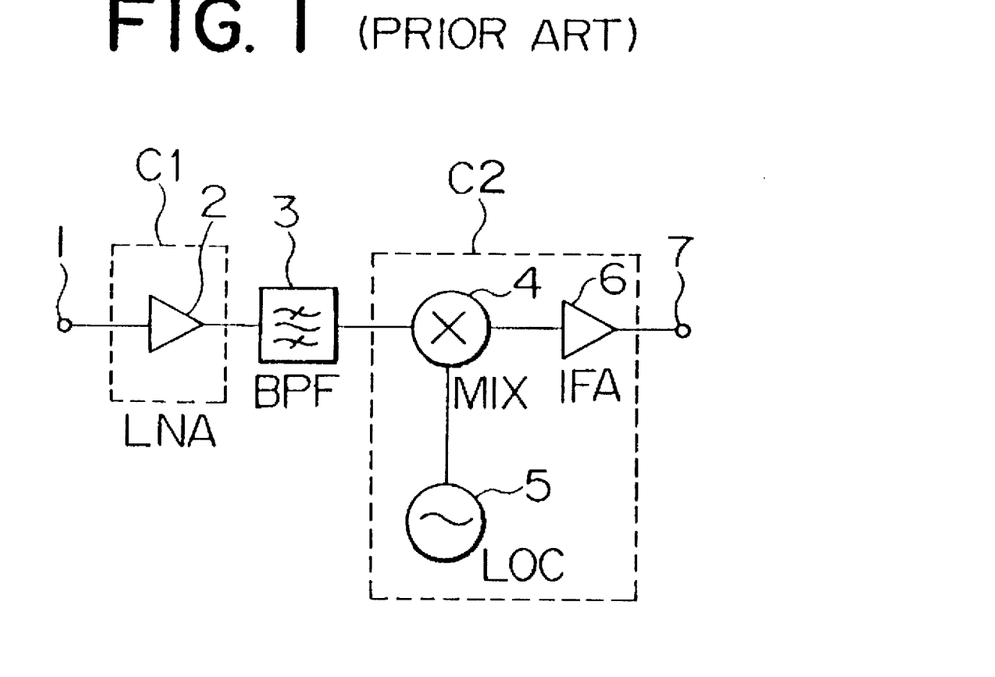
FIG. 1 is a block diagram showing the input stage of a satellite broadcasting direct receiver.

Micro-wave devices, such as communication devices, generally use a filter. FIG. 1 is a block diagram showing the structure of an input state (front end) of a satellite broadcasting direct receiver. A low-noise amplifier (LNA) 2 is connected to an input terminal 1, and its output is input to a band-pass filter 3. The output of the filter 3 is input to a mixer (MIX) 4, which mixes it with the output of a local oscillator (LOC) 5 and outputs the resultant signal to an intermediate-frequency amplifier (IFA) 6. The output of this intermediate-frequency amplifier 6 is output to an output terminal 7.

The filter 3 is used to prevent image disturbance and the influence of the image band noise of the low-noise amplifier 2. While it is desirable to design a semiconductor device including such a filter 3 into an IC circuit for miniaturization, the presence of the band-pass filter 3 makes it impossible to design the whole device on one chip. It is therefore inevitable to design the low-noise amplifier 2 alone on a single IC (chip C1) and design the mixer 4, local oscillator 5 and intermediate-frequency amplifier 6 on another single IC (chip C2), thus requiring at least two chips. It is thus difficult to miniaturize the semiconductor device.

Figure 2:
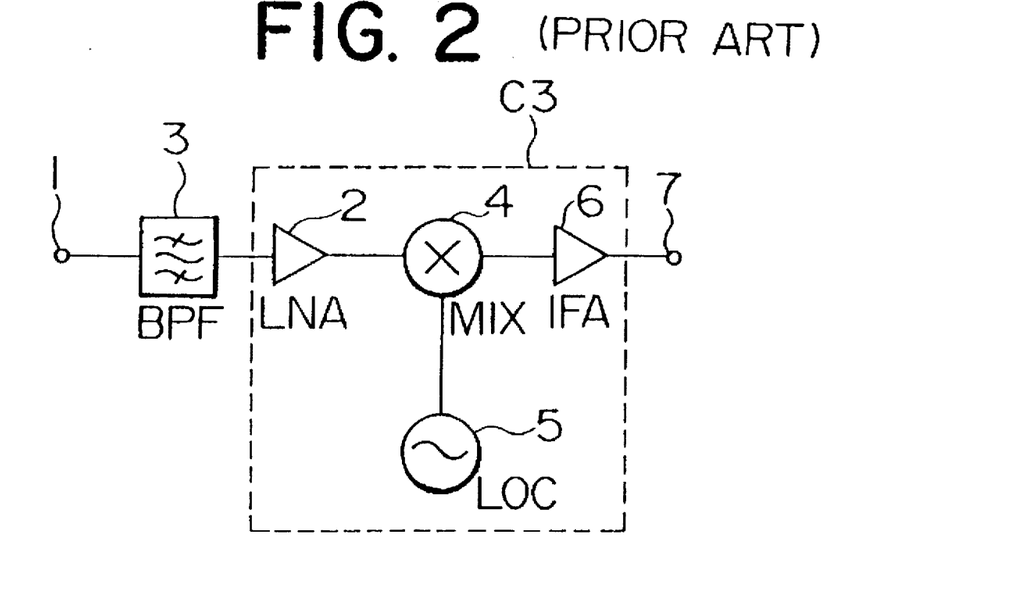
FIG. 2 is a block diagram showing the input stage of another satellite broadcasting direct receiver.

Alternatively, as shown in FIG. 2, the band-pass filter 3 may be shifted to the preceding stage to the low-noise amplifier 2, thus allowing all the low-noise amplifier 2, mixer 4, local oscillator 5 and intermediate-frequency amplifier 6 to be designed on one chip. The semiconductor device shown in FIG. 2 cannot, however, provide the effect of the filter 3 to remove the influence of the image band noise of the low-noise amplifier 2, and is disadvantageous in lower noise index over the semiconductor device shown in FIG. 1.

Figure 3:
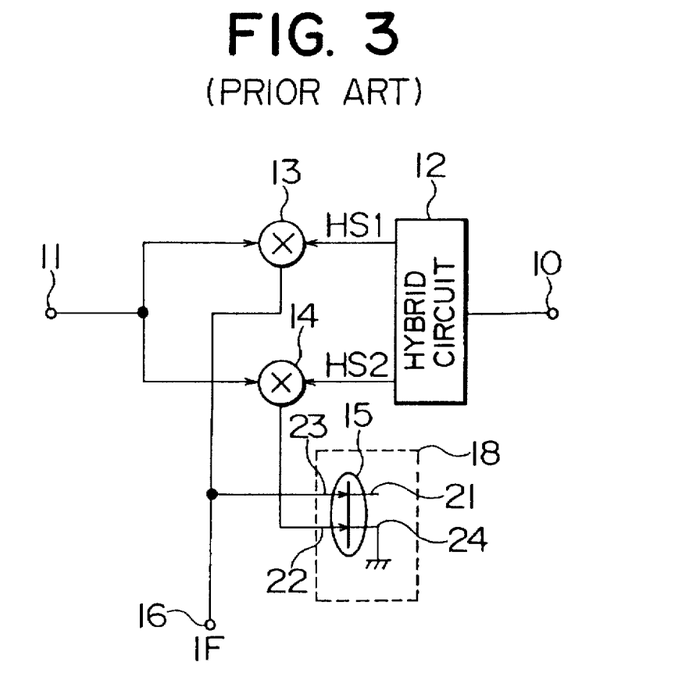
FIG. 3 is a block diagram of prior art 1.

To overcome this shortcoming, an image rejection type frequency converter as shown in FIG. 3 has been proposed (Japanese Unexamined Patent Publication No. sho 61-208304). As shown in FIG. 3, a first 90-degree hybrid circuit 12 in a signal band of the reception frequency and local oscillation frequency and a second hybrid circuit 18 in an intermediate frequency band are connected to each other by two frequency converters or mixers 13 and 14 positioned inbetween. A terminal 10 to which an input signal (RF) from an antenna or a signal from the local oscillator (LOC) is input, is connected to the first 90-degree hybrid circuit 12. A terminal 11 to which the signal from the local oscillator is input, is connected to the frequency converters 13 and 14. A terminal 16 from which the intermediate frequency (IF) is output is connected to the frequency converter 13 and the second hybrid circuit 18. The second hybrid circuit 18 is constituted of a dual-gate FET 15. This dual-gate FET 15 has a drain electrode 21, a first gate 22, a second gate 23 and a source 24. Input signals to the 90-degree hybrid circuit 12 are signals HS1 and HS2, which come from the terminal 10 and have a phase difference of 90 degree with respect to each other.

The dual-gate FET 15 has an equivalent capacitor provided between the drain electrode 21 and the second gate 23. When a signal is applied to the first gate 22, therefore, a signal phase difference of 90 degrees occurs between the aforementioned electrode output signals. The intermediate frequency signal output from the second gate 23 therefore becomes equivalent to the signal that is before the phase shift is accomplished by the hybrid circuit 12. This will cancel out the first phase shift by the hybrid circuit 12, thereby providing an image-rejection type frequency converter.

This circuit does not filter out an image signal using a filter, but uses two frequency mixers 13 and 14 to provide two outputs, and mixes both outputs with some phase difference to cancel out the image signal. This design permits the mentioned components to be designed on one chip without using any filter for image rejection.

Examples of an IC having a filter located between the low-noise amplifier and mixer are disclosed in IEEE MTT33 No. 11 pp. 1231–1235 and IEEE MMWMC 1992, pp. 101–104. As the frequency to be handled is high, both ICs employ a filter that uses a distributed constant circuit. The former IC employs an open stub as shown in FIGS. 4A and 4B, while the latter IC employs a bridge T as shown in FIGS. 5A and 5B.

Figure 6:
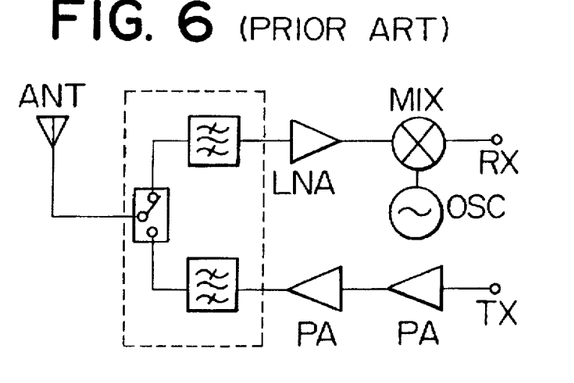
FIG. 6 shows the block diagram of a portable telephone.

Another example of a system that requires a filter is a transmitter-receiver of a portable telephone. FIG. 6 shows a block structure of such a transmitter-receiver of portable telephone. A duplexer is used for the conventional filter.

Figure 4A:
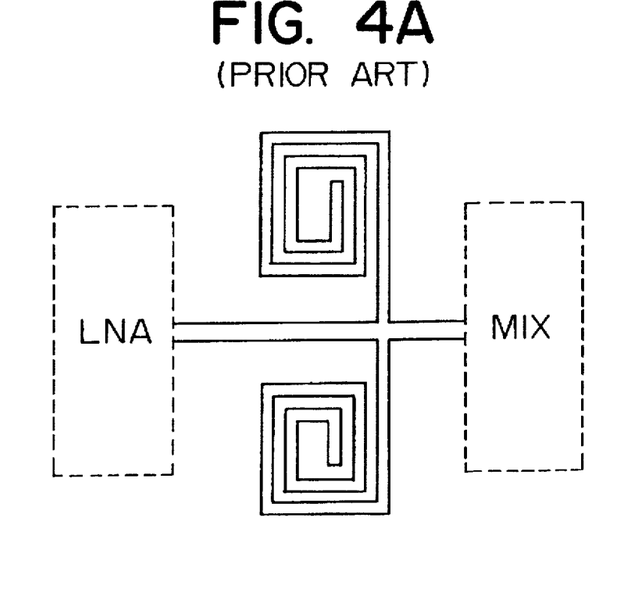
FIGS. 4A and 4B are pattern diagrams of prior art 2.
Figure 4B:
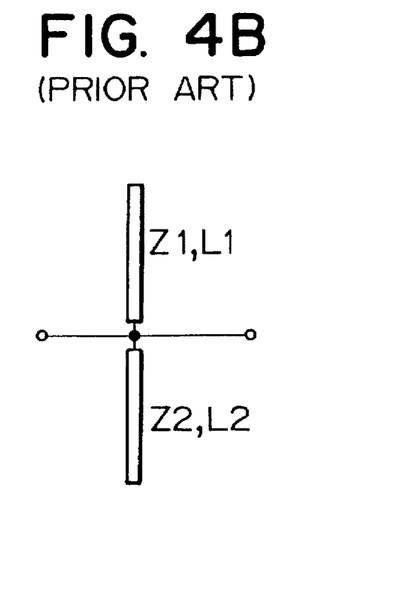
Figure 5A:
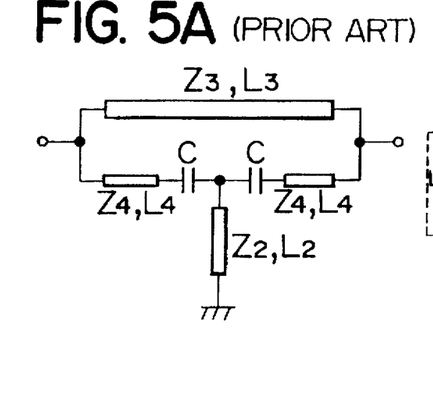
FIGS. 5A and 5B are pattern diagrams of prior art 3.
Figure 5B:
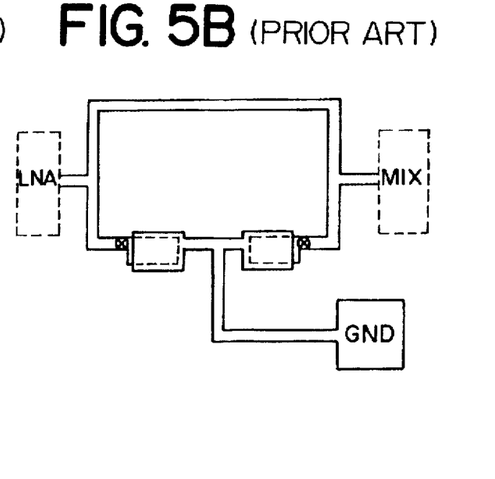

There are prior arts as shown in FIGS. 3 through 5 to design a semiconductor device including a filter into IC. But those prior arts have the following problems. The prior art shown in FIG. 3 cancels out the IF signal, resulting in poor converting characteristic, and is not thus practical. While the prior art shown in FIG. 4 and the prior art shown in FIG. 5 have been studied with their prototypes actually made, they have a shortcoming of an increased chip area due to the use of a distributed constant circuit. For instance, the prior art requires an area of 0.5 mm$^2$ and the prior art also requires an area of about 0.5 mm$^2$. Those problems become prominent in a system that is used in a 1-GHz band, such as a portable telephone.

SUMMARY OF THE INVENTION

It is therefore an object of the present invention to provide a semiconductor device having a filter circuit, which can be designed on a single chip and is used in a filter-incorporated system, and a one-chip IC having that filter circuit incorporated therein.

According to the present invention, a semiconductor device including a filter, comprises an input terminal to which an input signal is input; an amplifier connected to said input terminal; a mixer; a local oscillator for inputting a local oscillation signal to said mixer; and at least one 3-element series-and-parallel resonator, provided between said amplifier and said mixer, for performing series resonance and parallel resonance at a predetermined frequency by a combination of three elements including an inductor and a capacitor of concentrated or lumped constants.

A filter embodying the present invention is constituted of a 3-element series-and-parallel resonator having a combination of three elements including concentrated or lumped constant, oriented capacitors and inductors. When the filter circuit is designed with a concentrated or lumped constant, there are an infinite number of combinations of capacitors and inductors. To obtain the desired filtering performance, however, a 3-element type will minimize the chip area most efficiently.

Figure 7:
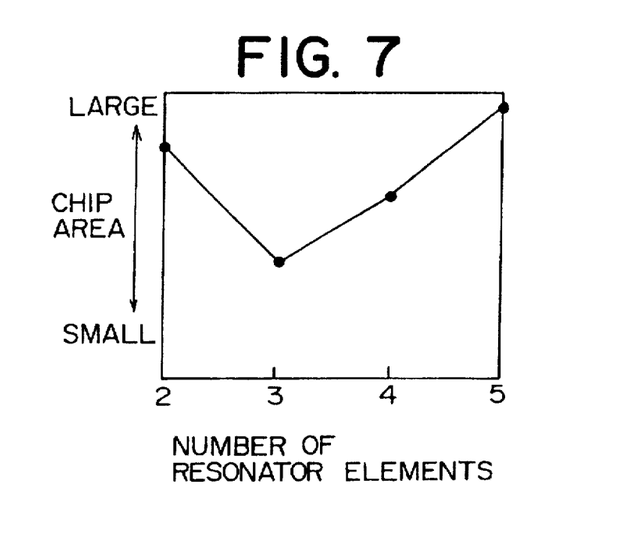
FIG. 7 is a diagram showing the relation between the number of elements in a resonator and the chip area.
Figure 8A:
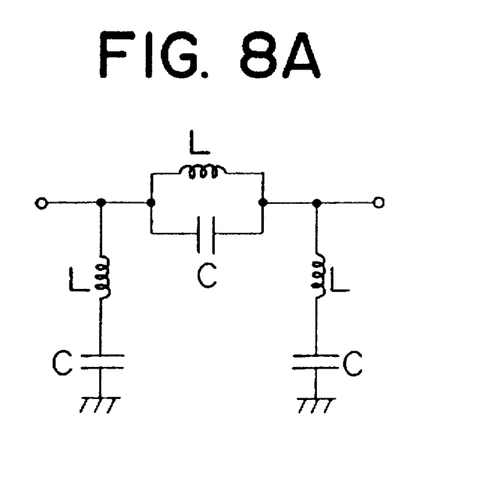
FIGS. 8A and 8B are circuit diagrams of 2-element filters.
Figure 8B:
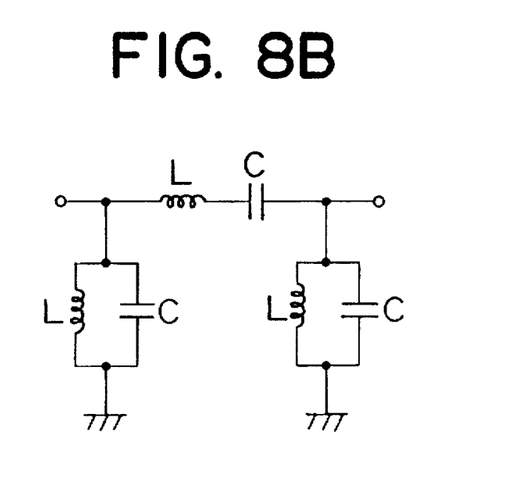
Figure 9A:
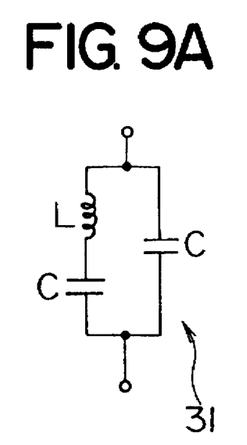
FIGS. 9A through 9D are circuit diagrams of 3-element filters.
Figure 9B:
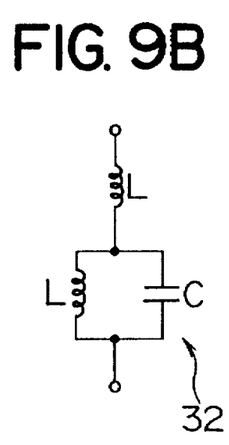
Figure 9C:
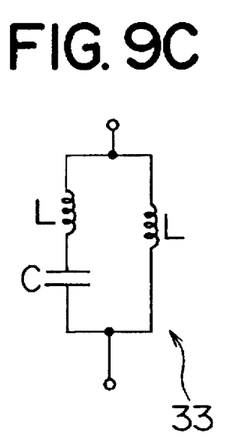
Figure 9D:
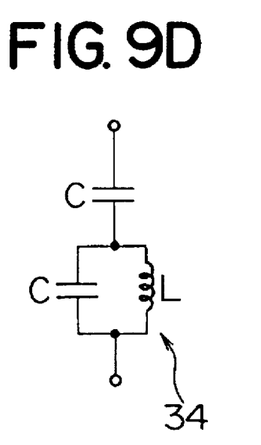

FIG. 7 shows the relation between the number of resonator elements and the chip area when the band width of the filter and the out of band performance are limited. For a 2-element filter having series or parallel resonators each using one capacitor and one inductor, the pass band or device band can be designed as shown in FIGS. 8A and 8B. To make the band width narrower to improve the out of band characteristic, it is necessary to use an inductor having a significantly large inductance, so that the chip size becomes large while the number of elements is small. For instance, in constituting a filter which will pass 910 to 956 MHz, and has a block band of 810 to 826 MHz and a block amount of 50 dB, an inductance L needs to be 60 nH for a 2-element filter, whereas the inductance L of 20 nH is sufficient for a 3-element filter. For a 4-element filter or a filter having more than four elements, the number of elements increases and the chip size becomes greater than that for the 3-element type. Therefore, the 3-element type will provide the desired filter characteristic with the smallest area. A narrow-band filter may be designed with a combination of 3-element-and-series parallel resonators, and will have the minimum area as a filter having a similar performance.

There are four possible combinations of 3-element series-and-parallel resonators 31, 32, 33 and 34 comprising three elements including an inductor L and a capacitor C, as shown in FIGS. 9A, 9B, 9C and 9D. When those 3-element series parallel resonators 31, 32, 33 and 34 are combined as shown in FIGS. 10A, 10B, 10C and 10D, the pass band and device band can be designed independently. Although two resonators are used for shunt and one resonator for series, a total of three resonators, in the examples of FIGS. 10A to 10D, one resonator may be used for shunt and for series, or two or more resonators may also be used.

According to this invention, a filter is constituted by the above-described 3-element series-and-parallel resonators and a combination thereof, allowing a filter-incorporated system to be designed on a single chip which could not be accomplished by the prior arts.

DETAILED DESCRIPTION OF THE PREFERRED EMBODIMENTS

Figure 11:
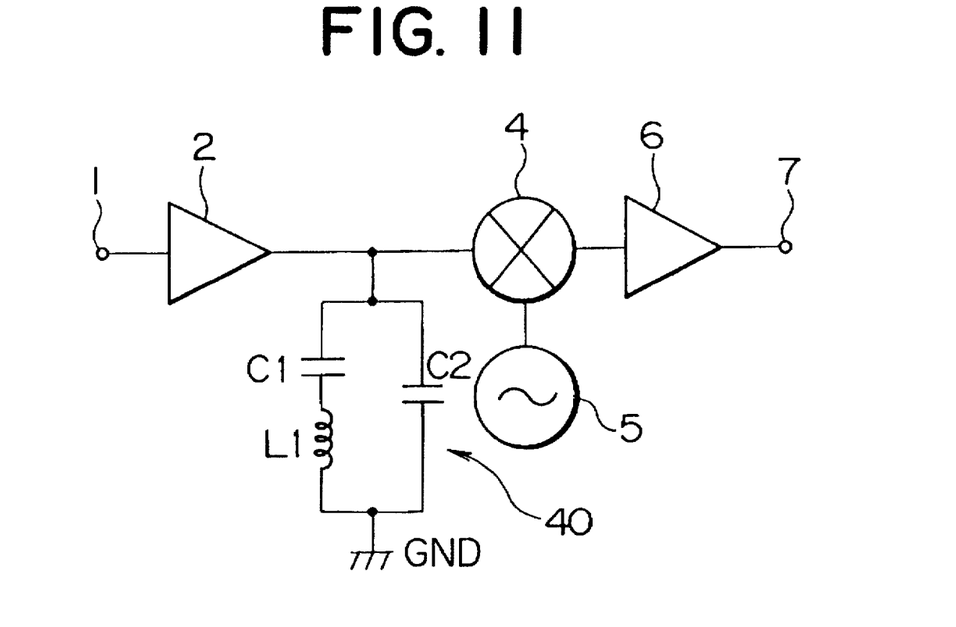
FIG. 11 is a circuit block diagram of a first embodiment of the present invention.

Preferred embodiments of the present invention will now be described referring to the accompanying drawings. FIG. 11 is a block diagram showing the structure of a first embodiment of the present invention as applied to a satellite broadcasting transmission/reception converter. As shown in FIG. 11, an input terminal 1 is connected to the input end of a low-noise amplifier 2 whose output is connected to a frequency mixer 4. A local oscillator 5 is connected to this frequency mixer 4 whose frequency-mixed signal is output to an intermediate-frequency amplifier 6. A signal amplified by the intermediate-frequency amplifier 6 is output to an output terminal 7. In this embodiment, a 3-element series-and-parallel resonator 40 is connected between the low-noise amplifier 2 and the frequency mixer 4. This 3-element series-and-parallel resonator 40 has a series circuit of a capacitor C1 and an inductor L1 and a capacitor C2 connected in parallel with that series circuit.

The satellite broadcasting reception converter performs frequency mixing of a weak signal of 12 GHz from a satellite with a signal of 10.7 GHz from a local oscillator 5, and outputs a signal of 1.3 GHz which is the difference between the input signal frequency and the local oscillation frequency. In this case, the frequency of a signal of 9.3 GHz becomes an image frequency, so that a filter for eliminating the signal of 9.3 GHz without attenuating the signal of 12 GHz should be provided in the preceding stage of the frequency mixer 4.

As the 3-element series parallel resonator 40 is connected between the low-noise amplifier 2 and the frequency mixer 4 in this embodiment, parallel resonance will be caused by the input signal frequency of 12 GHz and series resonance will be caused by the image frequency of 9.3 GHz if the inductor L1 is set to 1.0 nH, the capacitor C1 to 0.2 pF and the capacitor C2 to 0.5 pF.

Figure 12:
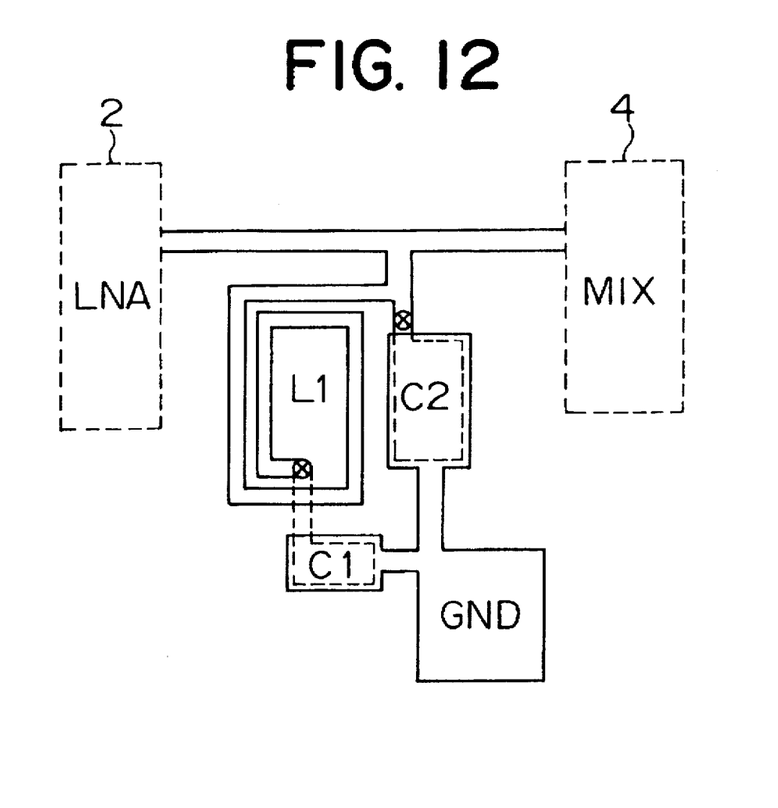
FIG. 12 is a pattern diagram of the first embodiment.

FIG. 12 shows a pattern diagram of the circuit of FIG. 11. In the 3-element series-and-parallel resonator 40 which constitutes a filter in this embodiment, the inductor L1 can be formed by a spiral inductor, and the capacitors C1 and C2 may be formed by metal-insulator-metal (MIM) capacitors. This permits a desired filter to be designed with an area of about 0.1 mm². Through evaluation of prototypes, it is found that this filter can accomplish image rejection of 15 dB or higher. This characteristic is better than that of the prior art, with a chip area being ⅕ of that of the prior art.

Figure 10A:
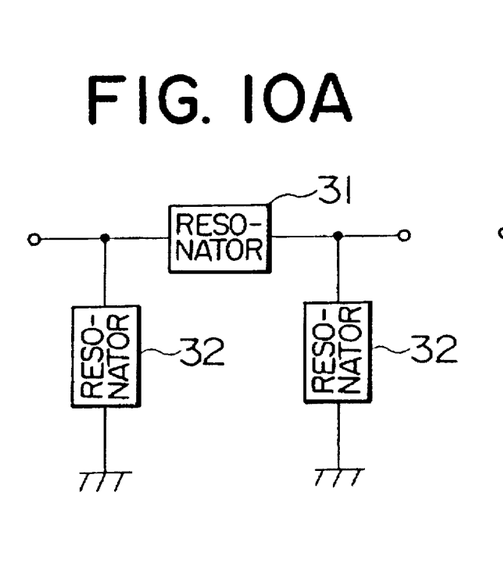
FIGS. 10A through 10D are diagrams showing combinations of 3-element filters.
Figure 10B:
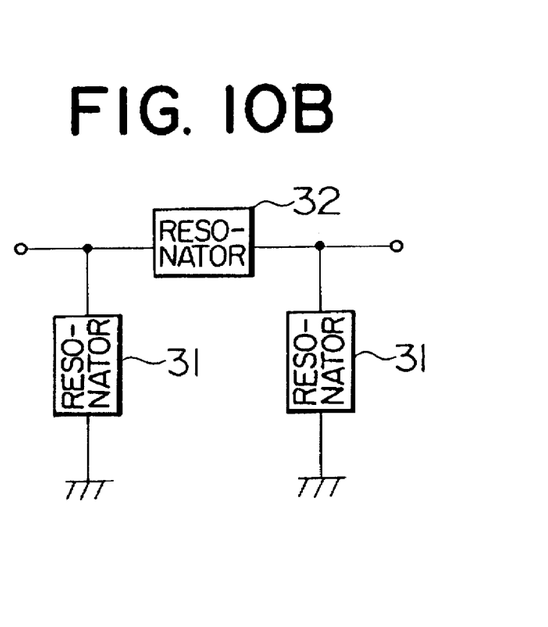
Figure 10C:
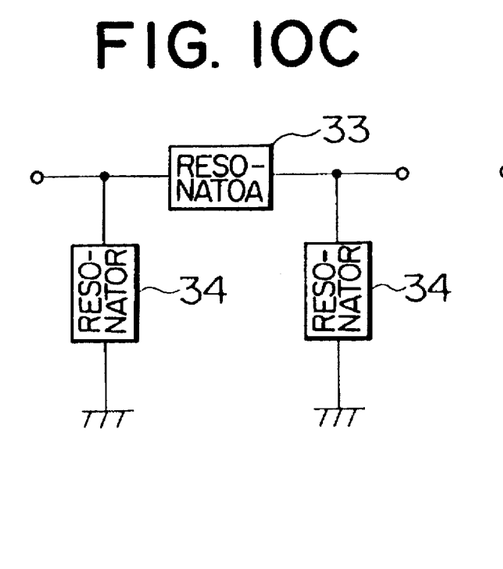
Figure 10D:
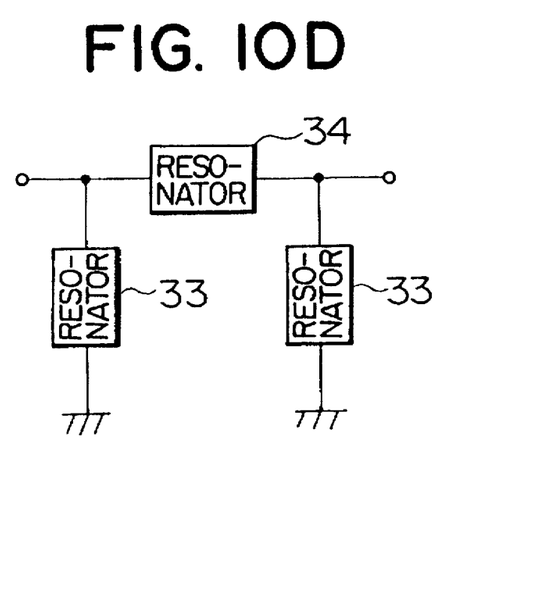
Figure 13:
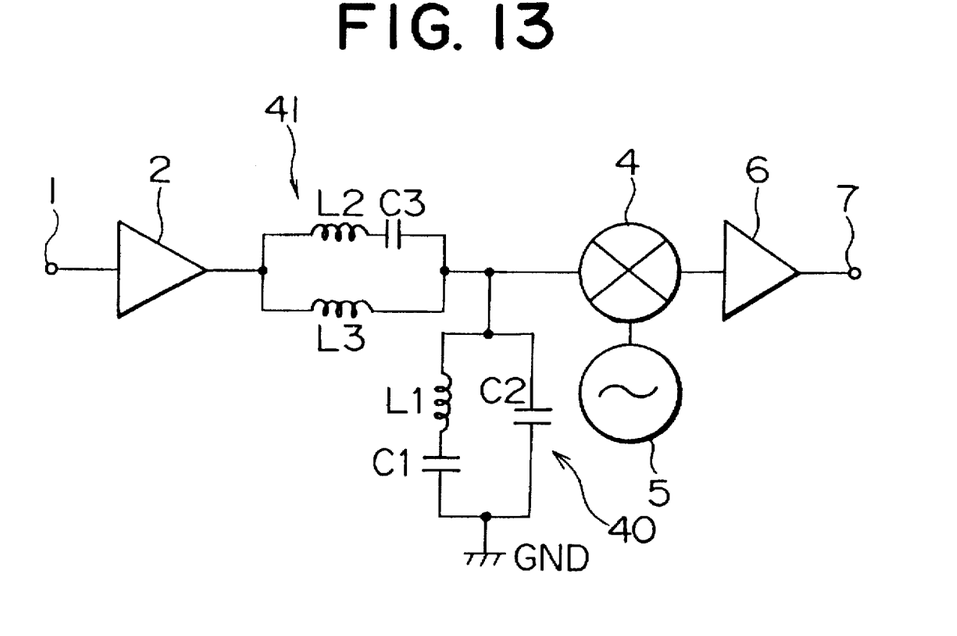
FIG. 13 is a circuit block diagram of a second embodiment of the present invention.
Figure 14:
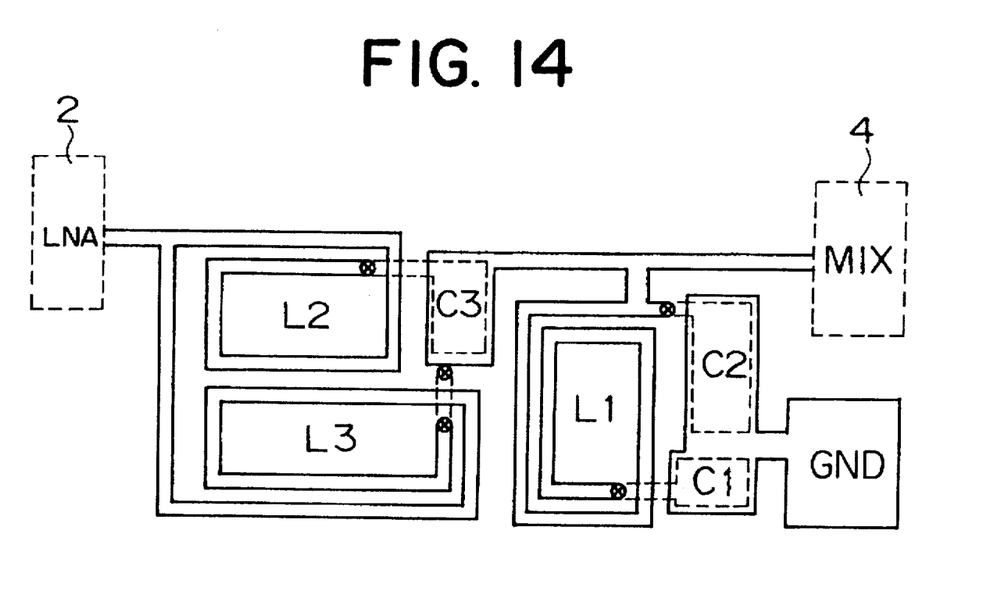
FIG. 14 is a pattern diagram of the second embodiment.

FIG. 13 is a block diagram showing the circuit of a second embodiment of this invention, and FIG. 14 is a pattern diagram of this circuit. In this embodiment, two 3-element series-and-parallel resonators 40 and 41 are used in the combination as shown in FIG. 10B. More specifically, in addition to the 3-element series-and-parallel resonator 40, the 3-element series-and-parallel resonator 41 is connected between the output of the low-noise amplifier 2 and the input of the mixer 4 in the second embodiment.

In this embodiment, image rejection of 30 dB or greater can be accomplished by setting the inductor L1 to about 1 nH, the capacitor C1 to about 0.2 pF, the capacitot C2 to about 0.5 pF, the inductor L2 to about 1 nH, the inductor L3 to about 1 nH, and the capacitor C3 to about 0.2 pF. The filter portion could be constituted with an chip area of 0.15 mm². The acquired performance is the same or better than that of the filter of the prior art shown in FIGS. 5A and 5B, and the chip area is ⅓ of that of the prior art of FIGS. 5A and 5B.

According to the present invention, as described above, the filter area can be reduced to ⅓ to ⅕ of that of the prior arts by using a 3-element series-and-parallel resonator as a filter, and a filter-incorporated system will be designed into a one-chip IC with a practical chip size.

The filter using a 3-element series-and-parallel resonator according to this invention is effective not only in a satellite broadcasting receiver as discussed in the foregoing description of the embodiments, but also in designing other filter-incorporated systems into IC circuits. Three or more 3-element series-and-parallel resonators may of course be used to constitute a filter.

What is claimed is:

1. A semiconductor device comprising an amplifier for amplifying an input signal and generating an amplified signal, a conductor line connected to said amplifier to transmit said amplified signal, an oscillator for generating a local oscillation signal, a mixer, coupled to said conductor line to receive said amplified signal therefrom and to said oscillator to receive said oscillation signal therefrom, for producing an intermediate frequency signal, and a resonator connected between said conductor line and a reference potential line, said resonator being a 3-element serial-and-parallel resonator including an inductor and at least one capacitor and constructed for performing a series resonance and a parallel resonance at a predetermined frequency of said amplified signal, wherein said resonator includes said inductor, a first capacitor and a second capacitor, and further includes a conductive layer branching off from said conductor line, said inductor being formed as a spiral conductor having a first end connected to said conductive layer and a second end, said first capacitor including a lower electrode formed by a first conductor connected to said conductive layer, a dielectric film formed by a first insulator formed on said first conductor and an upper electrode formed by a second conductor formed on said first insulator, said second capacitor including a lower electrode formed by a third conductor connected to said second end of said spiral conductor, a dielectric film formed by a second insulator formed on said third conductor and an upper electrode formed by a fourth conductor formed on said second conductor, and a fifth conductor connected to said second and fourth conductors and extending to said reference potential line.

2. A semiconductor device comprising an amplifier for amplifying an input signal and producing an amplified signal at an output thereof, a signal conductor line having a first end portion and a second end portion, a first resonator connected between said output of said amplifier and said first end portion of said signal conductor line, a second resonator connected between said signal conductor line and a reference potential line, an oscillator for generating a local oscillation signal at an output thereof, and a mixer, coupled to said second end portion of said signal conductor line and said output of said oscillator, for producing an intermediate frequency signal, each of said first and second resonators being a 3-element serial-and-parallel resonator including an inductor and at least one capacitor and constructed for performing a series resonance and a parallel resonance at a predetermined frequency, wherein said first resonator includes said inductor as a first inductor, said capacitor and a second inductor, and said second resonator includes said inductor, said capacitor as a first capacitor and a second capacitor;

said first resonator further includinq a first conductive layer branching off from said signal conductor line, said first inductor being formed as a spiral conductor having a first end connected to said first conductive layer and a second end, a second conductive layer branched off from said signal conductor line and connected to said first conductive layer, said second inductor being formed as a spiral conductor having a first end connected to said second conductive layer and a second end, and said capacitor being connected between said second end of said spiral conductor of said first inductor and said second end of said spiral conductor of said second inductor; said second resonator further including a second conductive layer branching off from said signal conductor line and connected to said capacitor of said first resonator, said inductor of said second resonator being formed as a spiral conductor having a first end connected to said first conductive layer of said second resonator and a second end, said first capacitor including a lower electrode formed by a first conductor connected to said second conductive layer, a dielectric film formed by a first insulator formed on said first conductor and an upper electrode formed by a second conductor formed on said first insulator, said second capacitor including a lower electrode formed by a third conductor connected to said second end of said spiral conductor, a dielectric film formed by a second insulator formed on said third conductor and an upper electrode formed by a fourth conductor formed on said conductor, and a fifth conductor connected to said second and fourth conductors and extending to said reference potential line.

* * * * *